United States Patent
Veerasamy et al.

(10) Patent No.: US 8,946,062 B2
(45) Date of Patent: Feb. 3, 2015

(54) POLYCRYSTALLINE SILICON THICK FILMS FOR PHOTOVOLTAIC DEVICES OR THE LIKE, AND METHODS OF MAKING SAME

(71) Applicant: Guardian Industries Corp., Auburn Hills, MI (US)

(72) Inventors: Vijayen S. Veerasamy, Ann Arbor, MI (US); Martin D. Bracamonte, Pinehurst, NC (US)

(73) Assignee: Guardian Industries Corp., Auburn Hills, MI (US)

( * ) Notice: Subject to any disclaimer, the term of this patent is extended or adjusted under 35 U.S.C. 154(b) by 212 days.

(21) Appl. No.: 13/682,786

(22) Filed: Nov. 21, 2012

(65) Prior Publication Data

US 2014/0138696 A1    May 22, 2014

(51) Int. Cl.
| | |
|---|---|
| H01L 21/02 | (2006.01) |
| H01L 29/04 | (2006.01) |
| C23C 16/02 | (2006.01) |
| C30B 25/18 | (2006.01) |
| C30B 29/06 | (2006.01) |
| H01L 31/0368 | (2006.01) |
| H01L 31/18 | (2006.01) |
| C23C 16/24 | (2006.01) |
| C23C 16/44 | (2006.01) |

(52) U.S. Cl.
CPC .......... *H01L 21/02595* (2013.01); *H01L 29/04* (2013.01); *C23C 16/0281* (2013.01); *C30B 25/18* (2013.01); *C30B 29/06* (2013.01); *H01L 21/02672* (2013.01); *H01L 21/02422* (2013.01); *H01L 21/02532* (2013.01); *H01L 21/02601* (2013.01); *H01L 31/03682* (2013.01); *H01L 31/182* (2013.01); *C23C 16/24* (2013.01); *C23C 16/44* (2013.01)

USPC .......... 438/479; 438/535; 438/502; 438/478; 438/89; 438/667; 257/75; 257/E31.04; 257/66; 257/777

(58) Field of Classification Search
USPC ................... 438/479, 535, 502, 478, 89, 667; 257/75, E31.04, 66, 777
See application file for complete search history.

(56) References Cited

U.S. PATENT DOCUMENTS

| | | |
|---|---|---|
| 3,651,385 A | 3/1972 | Kobayashi |
| 6,241,817 B1 | 6/2001 | Jang et al. |
| 6,777,714 B2 | 8/2004 | Muramatsu et al. |

(Continued)

FOREIGN PATENT DOCUMENTS

| | | |
|---|---|---|
| EP | 1 119 053 | 7/2001 |
| WO | WO 2012/095311 | 7/2012 |

OTHER PUBLICATIONS

"Study of Low-Temperature Crystallization of Amorphous Si Films Obtained Using Ferritin with Ni Nanoparticles"; Kirimura et al., Applied Physics Letters 86, 262106 (2005).

(Continued)

*Primary Examiner* — Cathy N Lam
(74) *Attorney, Agent, or Firm* — Nixon & Vanderhye P.C.

(57) ABSTRACT

A method of manufacturing a polycrystalline silicon film includes: depositing a catalyst layer including nickel and depositing nickel nanoparticles on a substrate; exposing the catalyst layer and the nanoparticles to at least silane gas; and heat treating the substrate coated with the catalyst layer and the nanoparticles during at least part of the exposing to silane gas in growing a silicon based film on the substrate.

16 Claims, 4 Drawing Sheets

(56) References Cited

U.S. PATENT DOCUMENTS

| | | |
|---|---|---|
| 8,367,769 B2 | 2/2013 | Aldwayyan et al. |
| 8,399,878 B2 | 3/2013 | Hieslmair et al. |
| 8,435,477 B2 | 5/2013 | Kambe et al. |
| 8,435,627 B2 | 5/2013 | Angelopoulos |
| 8,440,258 B2 | 5/2013 | Reiss et al. |
| 2005/0012099 A1 | 1/2005 | Couillard et al. |
| 2010/0167461 A1* | 7/2010 | Rana et al. .............. 438/97 |
| 2010/0237272 A1 | 9/2010 | Chaudhari |
| 2012/0184064 A1* | 7/2012 | Isaka et al. .............. 438/96 |

OTHER PUBLICATIONS

"Heteroepitaxial Silicon Film Growth at 600° C. from an Al—Si Eutectic Melt"; Chaudhari et al., Thin Solid Films 518 (2010) pp. 5368-5371.

* cited by examiner

POLYCRYSTALLINE SILICON THICK FILMS FOR PHOTOVOLTAIC DEVICES OR THE LIKE, AND METHODS OF MAKING SAME

This application relates to polycrystalline silicon films, e.g., with a grain size equal to or greater than 1 µm, for use in photovoltaic devices (e.g., solar cells) and the like, and methods of making the same.

BACKGROUND AND SUMMARY

A technology for reduced-cost photovoltaic modules involves the growth of thin-film polycrystalline silicon on substrates other than silicon wafers. Although the efficiencies of thin-film polycrystalline solar cells are lower than those of crystalline silicon solar cells, production costs are significantly lower as well and they are scalable for large area deposition. Thin-film polycrystalline cells also eliminate some of the quality constraints placed on monocrystalline material which may require costly processing steps, since the minority carrier diffusion length in the polycrystalline film need only be greater than its thickness.

Large-grained polycrystalline silicon material may be fabricated more cheaply than monocrystalline silicon by high-throughput processes such as casting or directional solidification to produce multicrystalline ingots. Although the majority and minority carrier properties of large-grained polycrystalline silicon are close to those of monocrystalline silicon, it has been shown that the presence of grain boundaries decreases the efficiencies of solar cells (due probably to large recombination rate) fabricated using this technology.

Because the open circuit voltage of polycrystalline cells increases with the grain size of the polycrystalline silicon above 1 µm, polycrystalline silicon thick films with a grain size equal to or greater than 1 µm are particularly desirable. Processes which enable deposition on low-cost substrates such as glass would be particularly desirable. When using a glass substrate, however, it is often desired that the temperature of the cell and/or substrate during silicon growth be kept at or below the transition temperature of the glass.

In certain example embodiments of this invention, there is provided a photovoltaic device (e.g., solar cell) comprising an absorber film (made up of one or more layers) comprising polycrystalline silicon having an average grain size equal to or greater than 1 µm.

According to an aspect of an exemplary embodiment, there is provided a substrate (e.g., glass or mica substrate) including nickel inclusive nanoparticles on the substrate, and a nickel inclusive catalyst thin film coated on the substrate which may be deposited before and/or after the catalyst thin film, wherein the nickel inclusive catalyst film may be of or include nickel optionally doped with phosphorus or the like. Heat treating and exposure to gas comprising silane may be used in forming a film of or including polycrystalline silicon.

In certain example embodiments of this invention, there is provided a method of manufacturing a polycrystalline film comprising silicon on a substrate, the method comprising: depositing a catalyst layer comprising nickel, and depositing nanoparticles, on the substrate; exposing the catalyst layer and the nanoparticles to silane gas; and heat treating the substrate coated with the catalyst layer and the nanoparticles during at least part of said exposing to silane gas, in growing a film comprising silicon on the substrate.

DETAILED DESCRIPTION OF EXEMPLARY EMBODIMENTS

Figure 1:
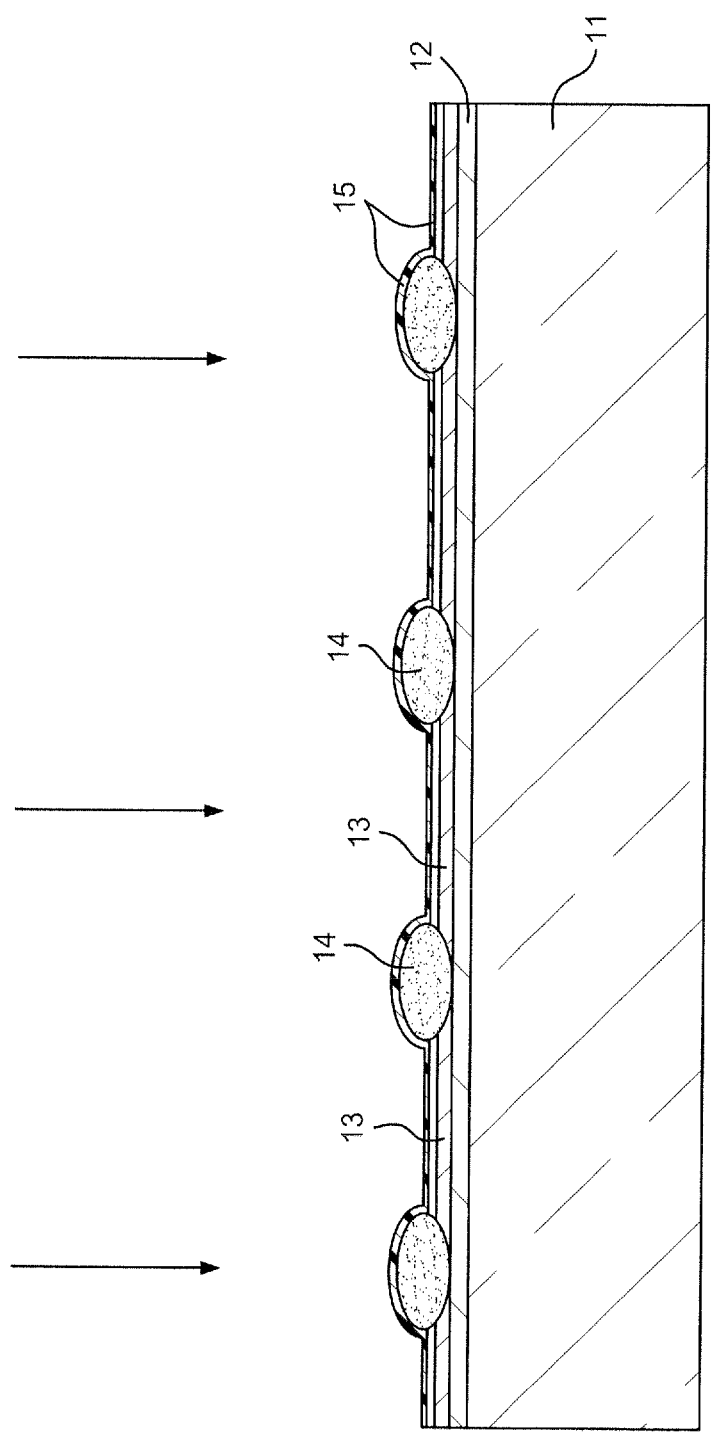
FIG. 1 is a cross sectional view illustrating a silicon (Si) film grown on a substrate (e.g., glass or mica substrate), during a process of manufacturing.

A detailed description of exemplary embodiments is provided with reference to the accompanying drawings. Like reference numerals indicate like parts throughout the drawings.

FIG. 1 illustrates a film of or including silicon 15 on a substrate 11 (e.g., glass or mica substrate). "On" as used herein includes both directly on and indirectly on. Thus, "on" as used herein does not require direct contact (e.g., a layer or film is "on" a substrate even if there are other layer(s) therebetween).

Referring to FIG. 1, substrate 11, buffer layer 12, catalyst 13, nickel nanoparticles 14, and silicon 15 are provided. The catalyst layer 13 may or may not be present in the product after the silicon film 15 is grown on the substrate 11.

Buffer layer 12 may be, for example, a transparent dielectric layer(s) (e.g., of or including zinc oxide or the like) formed on the glass substrate 11 in order to reduce nickel diffusion into glass substrate 11 during the process of making the silicon based film 15. For example, the buffer layer 12 may be made up of a dielectric or conductive layer of or including zinc oxide. Alternatively, the buffer layer 12 may have a dual-layer design and be made up of (i) such a zinc oxide layer formed on the substrate 11, and (ii) an ITO layer formed over the zinc oxide layer. Alternatively, the buffer layer 12 may be made up of three layers, such as ZnO/ITO/Ag, in certain example embodiments.

After forming of the buffer layer 12 on the glass substrate 11, a catalyst 13 is dispersed onto glass substrate 11. Catalyst 13 may be of or include nickel (e.g., eletrodeless nickel, such as a conductive layer of or including electrodeless deposited nickel). A nickel catalyst layer (continuous or discontinuous) 13 may be doped with boron to create a p-type silicon film 15, or may be doped with argon or phosphorous (for example, 6-10% atomic phosphorus) to create an n-type silicon film 15. Nanoparticles 14 of or including nickel are deposited on the substrate 11, before and/or after the catalyst 13 is deposited on the substrate 11. In certain preferred embodiments, the nanoparticles 14 are deposited on the substrate 11 via any suitable method after the catalyst 13 has been provided on the substrate 11. The substrate 11 is then heated to and/or using a high temperature of at least about 580 degrees C., more preferably at least about 620 degrees C. (e.g., to about 690 degrees C.). Silane gas is introduced into the reaction chamber, during and/or after the heating, and flowed over the hot metallized glass substrate 11 and the substrate 11 is rapidly thermally cycled. A gas (e.g., silane and/or a mixture of silane and hydrogen) may be introduced, and thermal cycling of the coated substrate being exposed is performed, in order to grow the silicon film 15 on the substrate.

Figure 2:
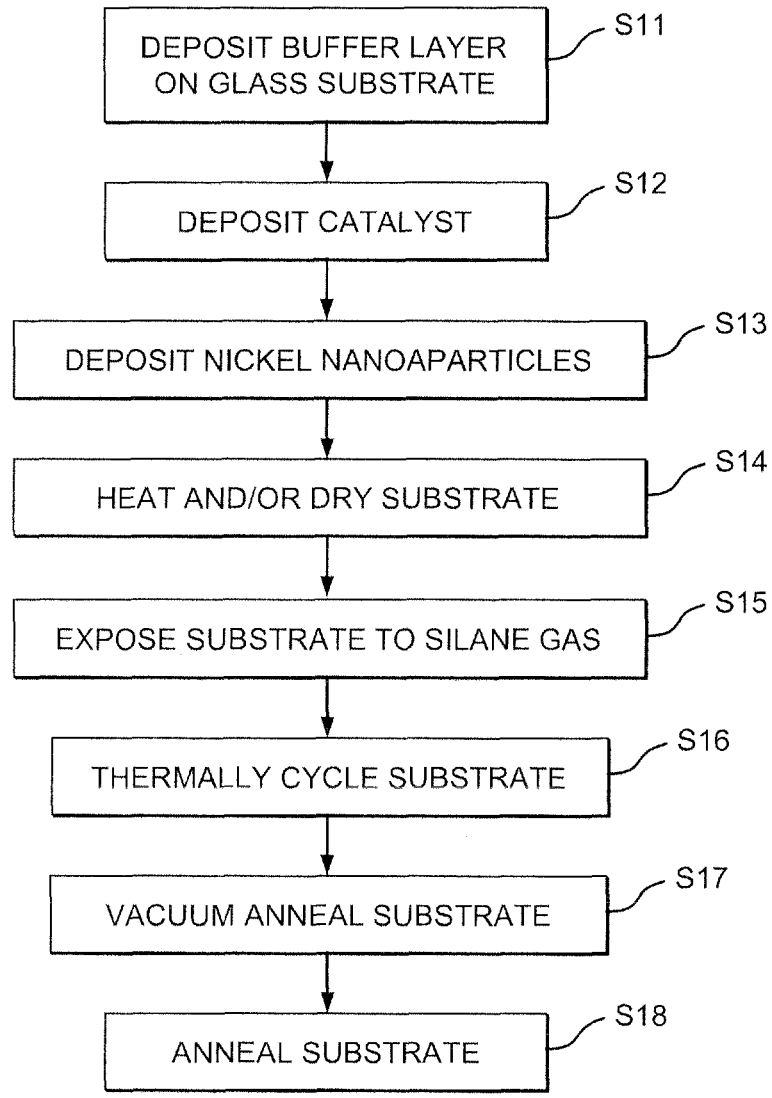
FIG. 2 is a flowchart illustrating a method of manufacturing polycrystalline silicon thick films with a grain size equal to or greater than 1 µm (e.g., as shown in FIG. 1), according to an exemplary embodiment.

FIG. 2 is a flowchart illustrating a method of manufacturing a polycrystalline silicon thick film with a grain size equal to or greater than 1 µm, via a catalytic CVD process, according to an exemplary embodiment, as shown in FIGS. 1-2. The substrate 11 may first be cleaned. A buffer layer(s) 12 is deposited on glass substrate 11 at S11. A catalyst thin film 13, of or including Ni, is deposited on glass substrate 11 over the buffer layer(s) 12 at S12. Ni and/or Ag catalyst 13 may be undoped in forming intrinsic type silicon films 15, or alternatively may be doped in forming n-type or p-type silicon film 15. For example, the nickel/silver catalyst 13 may be doped with phosphorus, arsenic, or antimony for providing an n-type silicon film 15, or for making a p-type silicon film the nickel/silver catalyst may be doped with boron. Doping amounts of any of these elements (P, Ar, antimony, and/or B) may be from about 0.5-12%, more preferably from about 0.5 to 7%, in certain example embodiments. In certain example embodiments, the catalyst may be doped with from about 6-10% atomic phosphorus to create an n-type silicon film (% amounts are atomic % herein). The catalyst 13 may be amorphous (e.g., amorphous Ni) or substantially amorphous as deposited, and may be deposited using magnetron sputter vacuum deposition (MSVD), electrodeless deposition, arc evaporation, e-beam evaporation, or cathodic arc in different example embodiments. The catalyst 13 may be from about 0.01 to 2 µm thick, more preferably from about 0.1 to 1 µm thick, in certain example embodiments.

A slurry of nickel nanoparticles 14 (e.g., nanoparticles in a medium such as water or other solution) are dispersed (e.g., via spray coating) onto substrate 11 via a colloidal aqueous mixture at S13, preferably after the catalyst 13 has been deposited or at least partially deposited. The water or other solution (see the layer in FIG. 1 between catalyst 13 and silicon 15) in the slurry may or may not be permitted or caused to evaporate before and/or during formation of the silicon 15. Optionally, steps S12 and S13 may be inverted, so that the nanoparticles 14 are deposited on the substrate before the catalyst film 13 is deposited. Optionally, nanoparticles 14 may be deposited on the substrate both before and after the catalyst film 13 is formed. After deposition of the nanoparticles 14, substrate 11 is heated and/or dried at S14, which may cause the water or other solution deposited along with the nanoparticles 14 to evaporate partially or fully, leaving the nanoparticles 14 on the substrate. For example, the coated substrate may be heated to and/or using a high temperature of at least about 580 degrees C., more preferably at least about 620 degrees C. (e.g., to about 690 degrees C.). As coated substrate is heated, for example, the phosphorus or other dopant included in the catalyst 13 may diffuse into the substrate 11 at a higher rate than the nickel included in catalyst 13. The relative ratio of phosphorus or other dopant to nickel diffused into the glass substrate depends on the rates of heating and cooling of the glass. If the coated substrate is rapidly heated (for example, by rapid thermal annealing of glass) the ratio is high and nickel does not significantly diffuse into the glass. The buffer layer(s) 12 prevents or reduces Ni diffusion into the substrate 11 (from the catalyst and/or nanoparticles). As the phosphorous or other dopant diffuses into the glass or mica substrate 11, the nickel catalyst 13 crystallizes and roughens by at least one order of magnitude.

Gas (e.g., of or including silane gas, without any significant amount of carbon) is then introduced into the reaction chamber and flowed over the hot substrate 11 that is coated with buffer layer(s) 12 and nanoparticles 14 at S15, and a seed layer 15 of or including amorphous and/or nanocrystalline silicon is formed on the catalyst 13 and on the nanoparticles 14, and silicon continues to grown on the seed layer in forming the film 15 of or including polycrystalline silicon. The gas may be silane gas, or alternatively may be a mixture of silane and hydrogen gas (e.g., either pure silane (e.g., $SiH_4$) gas, or a mixture of silane and hydrogen gas such as a mixture having a ratio such as from about 1:1 to 1:10 $SiH_4:H_2$ gas). The amorphous and/or polycrystalline silicon seed layer 15 is conformal or substantially conformal to the catalyst film 13 and nanoparticles (e.g., see FIG. 1), but the silicon around the crystalline nickel particles 14 is typically richer in crystalline content and grows around the nanoparticles 14. The coated substrate is rapidly thermally cycled while the gas (e.g., silane gas or a mixture of silane and hydrogen as discussed above) flows over the catalyst and nanoparticles at S16, in forming the seed film 15 (see downward arrows in FIG. 1). Further growth of the silicon film 15 occurs when the coated substrate is rapidly thermally cycled with the flow of the silane gas over the catalyst and nanoparticles. The rapid thermal cycling may be or include, for example, raising temperature to from about 580-800 degrees C. (more preferably from about 600-700 degrees C.), then back down to about room temperature, then back up to from about 580-800 degrees C. (more preferably from about 600-700 degrees C.), and then back down to about room temperature, and so forth repeating, in order to manage stress in the film 15 so that it doesn't significantly crack, thereby promoting further growth of the silicon film 15. FIG. 1 illustrates the silicon film 15 at this point, before the entire film 15 has been grown and possibly before it has been fully crystallized. It is also possible to laser treat the silicon as its growing in order to crystallize the silicon and promote high quality crystal growth (e.g., this could be used in addition to, or instead of, the rapid thermal cycling). The double sided layer growth of silicon on both sides of the nickel inclusive catalyst layer 13, and around the nanoparticles 14, may eventually lift off the catalyst layer 13 from the surface of substrate 11, but the silicon film 15 in contact with the substrate 11 surface may remain anchored to the substrate 11.

The above described rapid thermal cycling may be continued in growing the silicon film 15. Alternatively, after at least some rapid thermal cycling at S16, a more moderate temperature along with silane/hydrogen gas exposure may be used in further growing the silicon film 15. For example, after S16, further heat treatment of the initial silicon seed layer 15 at a lower temperature (e.g., at or using from about 400-560 degrees C., more preferably from about 440-520 degrees C., most preferably about 485 degrees C.) while exposing the seed layer and nickel to a gas mixture of silane and hydrogen (for example, from about a 1:20 to 1:40 ratio, most preferably about a 1:30 ratio, of $SiH_4:H_2$) may be performed to promote further growth of the silicon amorphous and/or crystalline film 15. The silicon film 15 at this point is preferably a mixture of amorphous and crystalline silicon.

Thereafter, during a vacuum annealing process at S17, the silicon film 15 as a whole begins to crystallize, with the nanoparticles 14 (e.g., Ni nanoparticles) serving as heterogeneous nucleation sites for grain growth. Doping with P has been found to increase the crystallization rate. The vacuum annealing may be performed at from about 400-600 degrees C., more preferably from about 450-550 degrees C., and most preferably at about 500 degrees C. The resulting polycrystalline film (grown from but thicker than film 15 shown in FIG. 1) eventually covers and thus is thicker than the nanoparticles 14, and has average grain sizes on the order of from about 1-25 µm, more preferably from about 5-15 µm (e.g., about 10 µm), with low-angle grain boundaries. Optional further annealing at S18 may be performed, for example at temperature from about 500-700 degrees C. (e.g., about 600 degrees C.), in order to further or completely crystallize the Si grains in the polycrystalline film. The zone of crystallization may extend substantially radially outward from the nanoparticles 14 as viewed from above. For example, as viewed from above, the zone of crystallization extend outwardly from the nanoparticles 14 into areas that were made up of amorphous silicon, with the extending crystallization eventually resulting in a polycrystalline silicon film. Seeded grains impinge on each other to form the resulting crystallized film. The largest grains in the polycrystalline silicon film may be from about 20-25 µm in certain example embodiments. As mentioned above, the polycrystalline silicon film may be electrically doped (e.g., with B, Ar, P, etc.) in order to create a p-type or n-type film based on the dopant.

Figure 4:
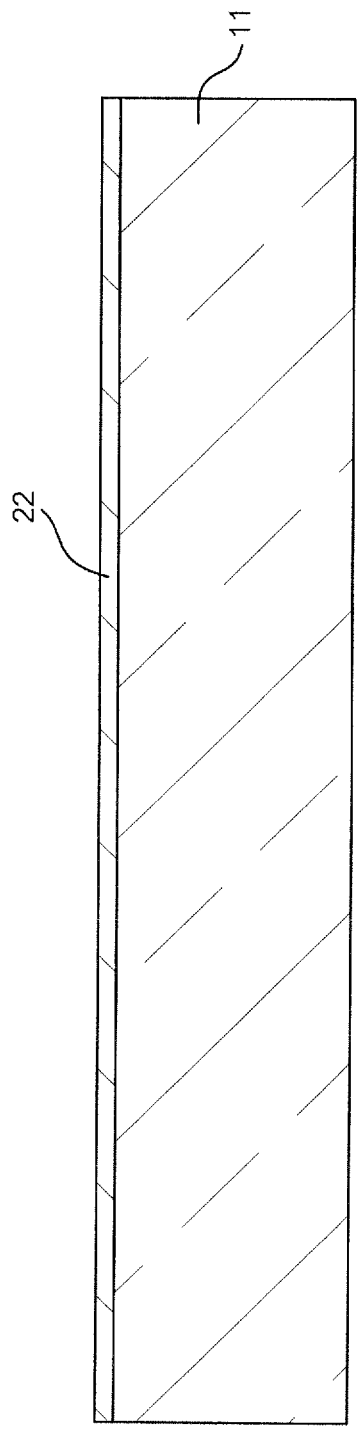
FIG. 4 is a cross sectional view of a conductive layer on another glass substrate, onto which a polycrystalline silicon film made according to any of FIGS. 1-3 is to be transferred.

The highly textured polycrystalline silicon film, grown via hetero-epitaxial growth as explained above, and the glass or mica substrate 11 (and possibly the metallic or substantially metallic layer 13) that supports it from FIGS. 1-2 may be used in a photovoltaic device such as a solar cell. For example, the polycrystalline silicon film may be part of, or an entire, semiconductor absorber layer in the photovoltaic device. Alternatively, in certain other example embodiments of this invention, the polycrystalline silicon film formed on the substrate 11 (e.g., glass or mica substrate) from FIGS. 1-2 may be transferred from the substrate 11 onto another substrate such as the another substrate shown in FIG. 4 for use in a photovoltaic device or the like. For example, the another substrate (e.g., see FIG. 4) may be coated with a conductive layer of Mo, ITO (e.g., an electrode) 22 or the like. The substrate 11 with the polycrystalline silicon layer thereon may be bonded (e.g., ionically bonded) to the coated another substrate, and the substrate 11 (and possibly the catalyst layer 13 if it remains) then being removed (e.g., via etching or stripping) so as to leave the polycrystalline silicon film on the another substrate (e.g., glass substrate) over the conductive layer of Mo, ITO, or the like.

Figure 3:
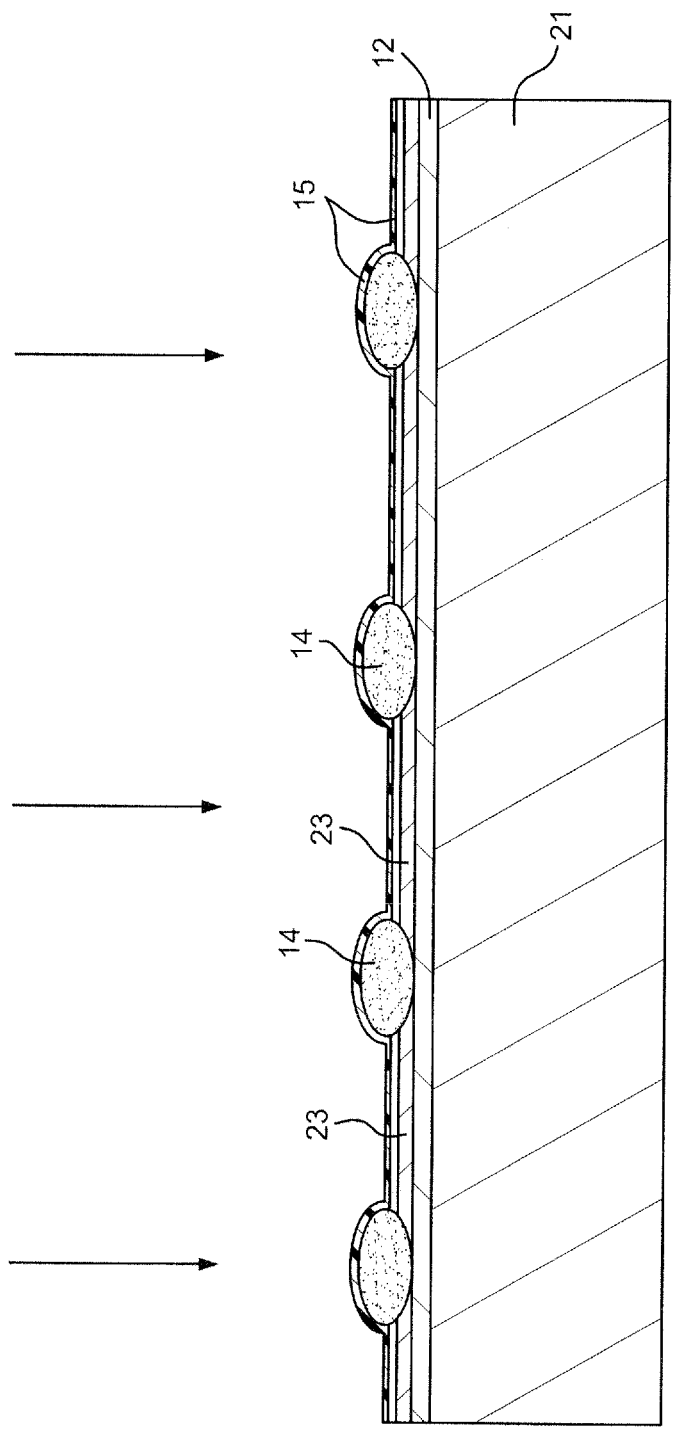
FIG. 3 is a cross sectional view illustrating silicon (Si) on a mica substrate.

FIG. 3 illustrates a technique for growing a polycrystalline silicon film on a mica substrate 21 according to another embodiment of this invention. The buffer layer 12, nanoparticles 14, and silicon film 15 may be the same as those described above in connection with FIGS. 1-2. The catalyst film 23 (possibly doped as explained above) may be made entirely or mainly of Ni as described above regarding film 13 in connection with FIGS. 1-2, or alternatively may be made entirely or mainly of a mixture of Ag and Ni. Mica substrate 21 may be, for example, muscovite mica comprising three monatomic sub-layers: aluminum oxide sandwiched between two sub-layers of silicon dioxide. For example, a mica substrate 21 is cleaved. Mica substrate 21 may be repeatedly heated to a temperature above 300 degrees C. and pressure is reduced to a near-vacuum state (for example, approximately $1 \times 10^{-6}$ Torr). Mica substrate 21 may then be coated with a nickel/silver catalyst thin film 23 and nickel nanoparticles 14 opposite the cleaved side. Nickel/silver catalyst 23 may be epitaxially grown, for example through e-beam physical vapor deposition. Inclusion of a dopant (e.g., phosphorous or the like) can be done either via the solid phase catalyst or in gas phase, for creating an n-type or p-type polycrystalline silicon film. Sequential introduction of growth of relevant dopant (e.g., in the gas phase) can be done with a view of creating a PIN layer with the i-layer being the thickest in certain example embodiments. At least silane gas is introduced into the reaction chamber and flowed over the hot metallized mica substrate 21. A layer of amorphous and nanocrystalline silicon is formed onto the catalyst 23. Mica substrate 21 is annealed at very high temperatures (for example, 1100 degrees C.). Polycrystalline silicon film is grown on mica substrate 21 as explained above in connection with FIGS. 1-2, and then may be transferred to the another coated glass substrate of FIG. 4.

In certain embodiments of this invention, there is provided a method of manufacturing a polycrystalline film comprising silicon on a substrate, the method comprising: depositing a catalyst layer comprising nickel, and depositing nanoparticles, on the substrate; exposing the catalyst layer and the nanoparticles to silane gas; and heat treating the substrate coated with the catalyst layer and the nanoparticles during at least part of said exposing to silane gas, in growing a film comprising silicon on the substrate.

The method of the immediately preceding paragraph may further comprise annealing the substrate coated with the catalyst layer and the nanoparticles in order to crystallize the film comprising silicon and form a film comprising polycrystalline silicon.

In the method of any of the preceding two paragraphs, the film comprising polycrystalline silicon may be doped with phosphorus, arsenic, boron, and/or the like.

The method of any of the preceding three paragraphs may further comprise transferring the film comprising polycrystalline silicon from the substrate to another substrate that is coated with at least a conductive layer.

In the method of any of the preceding four paragraphs, said heat treating may comprise thermal cycling the substrate coated with the catalyst layer and the nanoparticles. The thermal cycling may comprise repeatedly raising temperature to from about 580-800 degrees C. then back down to a significantly lower temperature (e.g., room temperature, or a temperature from about 40-250 degrees C.).

In the method of any of the preceding five paragraphs, the nanoparticles may comprise or consist essentially of nickel.

In the method of any of the preceding six paragraphs, the catalyst film may comprise nickel and silver.

In the method of any of the preceding seven paragraphs, the catalyst film may be doped with phosphorous.

In the method of any of the preceding eight paragraphs, the substrate may be a glass substrate or a mica substrate.

The method of any of the preceding nine paragraphs may further comprise depositing a dielectric layer comprising metal oxide on the substrate, the dielectric layer comprising metal oxide being located between the substrate and the nanoparticles. The metal oxide may comprise, for example, zinc oxide.

In the method of any of the preceding ten paragraphs, said catalyst layer may be deposited via electrodeless plating.

The forgoing exemplary embodiments are intended to provide an understanding of the disclosure to one of ordinary skill in the art. The forgoing description is not intended to limit the inventive concept described in this application, the scope of which is defined in the following claims.

What is claimed is:

1. A method of manufacturing a polycrystalline film comprising silicon on a substrate, the method comprising:
    depositing a catalyst layer comprising nickel, and depositing nanoparticles, on the substrate;
    exposing the catalyst layer and the nanoparticles to silane gas; and
    heat treating the substrate coated with the catalyst layer and the nanoparticles during at least part of said exposing to silane gas, in growing a film comprising silicon on the substrate.

2. The method of claim 1, further comprising annealing the substrate coated with the catalyst layer and the nanoparticles in order to crystallize the film comprising silicon and form a film comprising polycrystalline silicon.

3. The method of claim 2, wherein the film comprising polycrystalline silicon is doped with phosphorus.

4. The method of claim 2, further comprising transferring the film comprising polycrystalline silicon from the substrate to another substrate that is coated with at least a conductive layer.

5. The method of claim 2, wherein the film comprising polycrystalline silicon is doped with one or more of phosphorus, arsenic, and boron.

6. The method of claim 1, wherein said heat treating comprises thermal cycling the substrate coated with the catalyst layer and the nanoparticles.

7. The method of claim 6, wherein the thermal cycling comprises repeatedly raising temperature to from about 580-800 degrees C. then back down to a significantly lower temperature.

8. The method of claim 1, wherein the nanoparticles comprise nickel.

9. The method of claim 1, wherein the catalyst film comprises nickel and silver.

10. The method of claim 1, wherein the catalyst film is doped with phosphorous.

11. The method of claim 1, wherein the substrate is a glass substrate.

12. The method of claim 1, wherein the substrate comprises mica.

13. The method of claim 1, further comprising depositing a dielectric layer comprising metal oxide on the substrate, the dielectric layer comprising metal oxide being located between the substrate and the nanoparticles.

14. The method of claim 9, wherein the metal oxide comprises zinc oxide.

15. The method of claim 1, wherein said catalyst layer comprising nickel is deposited via electrodeless plating.

16. A method of manufacturing a polycrystalline film comprising silicon on a substrate, the method comprising:

depositing a catalyst layer, and depositing nanoparticles comprising nickel, on the substrate;

exposing the catalyst layer and the nanoparticles to silane gas; and heat treating the substrate coated with the catalyst layer and the nanoparticles during at least part of said exposing to silane gas, in growing a film comprising silicon on the substrate.

* * * * *